United States Patent
Liu et al.

(10) Patent No.: US 10,128,207 B2
(45) Date of Patent: Nov. 13, 2018

(54) SEMICONDUCTOR PACKAGES WITH PILLAR AND BUMP STRUCTURES

(71) Applicant: STMicroelectronics Pte Ltd, Singapore (SG)

(72) Inventors: Yun Liu, Singapore (SG); Jerome Teysseyre, Ang Mo Kio (SG); Yonggang Jin, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/674,891

(22) Filed: Mar. 31, 2015

(65) Prior Publication Data

US 2016/0293559 A1 Oct. 6, 2016

(51) Int. Cl.
*H01L 23/48* (2006.01)
*H01L 23/52* (2006.01)
*H01L 29/40* (2006.01)
*H01L 23/00* (2006.01)
(Continued)

(52) U.S. Cl.
CPC .............. *H01L 24/13* (2013.01); *H01L 21/78* (2013.01); *H01L 23/3178* (2013.01); *H01L 23/3192* (2013.01); *H01L 24/05* (2013.01); *H01L 24/11* (2013.01); *H01L 2224/02313* (2013.01); *H01L 2224/02319* (2013.01); *H01L 2224/0391* (2013.01); *H01L 2224/0401* (2013.01); *H01L 2224/05008* (2013.01); *H01L 2224/05022* (2013.01); *H01L 2224/05124* (2013.01); *H01L 2224/05569* (2013.01); *H01L 2224/05571* (2013.01); *H01L 2224/05572* (2013.01); *H01L 2224/11334* (2013.01); *H01L 2224/13023* (2013.01); *H01L 2224/13111* (2013.01); *H01L 2224/13116* (2013.01); *H01L 2224/13139* (2013.01); *H01L 2224/13147* (2013.01); *H01L 2224/94* (2013.01); *H01L 2924/00014* (2013.01)

(58) Field of Classification Search
CPC ... H01L 2224/12105; H01L 2224/0239; H01L 2224/0233; H01L 2224/02373; H01L 2224/81; H01L 2924/181; H01L 2224/96
USPC ........ 257/758, 780, 781; 438/612, 613, 614, 438/622, 625
See application file for complete search history.

(56) References Cited

U.S. PATENT DOCUMENTS 6,841,875 B2 *  1/2005  Ohsumi .............. H01L 23/3114
                                                    257/737
7,432,604 B2 * 10/2008  Farnworth .......... H01L 21/3043
                                                    257/780

(Continued)

FOREIGN PATENT DOCUMENTS

| CN | 1523665 A | 8/2004 |
| CN | 1638102 A | 7/2005 |
| CN | 1744309 A | 3/2006 |

*Primary Examiner* — S. V. Clark
(74) *Attorney, Agent, or Firm* — Seed Intellectual Property Law Group LLP

(57) ABSTRACT

One or more embodiments are directed to semiconductor packages that include a pillar and bump structures. The semiconductor packages include a die that has recess at a perimeter of the semiconductor die. The semiconductor package includes an encapsulation layer that is located over the semiconductor die filling the recess and surrounding side surfaces of the pillars. The package may be formed on a wafer with a plurality of die and may be singulated into a plurality of packages.

14 Claims, 9 Drawing Sheets

(51) Int. Cl.
  *H01L 23/31* (2006.01)
  *H01L 21/78* (2006.01)

(56) References Cited

U.S. PATENT DOCUMENTS

| | | | | |
|---|---|---|---|---|
| 7,626,269 | B2* | 12/2009 | Oliver | H01L 21/561 |
| | | | | 257/512 |
| 9,035,468 | B2* | 5/2015 | Shih | H01L 24/13 |
| | | | | 257/778 |
| 2009/0309212 | A1* | 12/2009 | Shim | H01L 21/568 |
| | | | | 257/700 |
| 2009/0315170 | A1* | 12/2009 | Shim | H01L 21/6835 |
| | | | | 257/692 |
| 2011/0304045 | A1* | 12/2011 | Liu | B82Y 10/00 |
| | | | | 257/738 |
| 2013/0168874 | A1* | 7/2013 | Scanlan | H01L 21/56 |
| | | | | 257/782 |
| 2014/0284791 | A1* | 9/2014 | Do | H01L 25/0657 |
| | | | | 257/737 |
| 2014/0339712 | A1 | 11/2014 | Alvarado et al. | |
| 2015/0021754 | A1* | 1/2015 | Lin | H01L 23/5389 |
| | | | | 257/712 |
| 2015/0035139 | A1* | 2/2015 | Shih | H01L 24/13 |
| | | | | 257/737 |
| 2015/0108635 | A1* | 4/2015 | Liang | H01L 28/10 |
| | | | | 257/737 |

* cited by examiner

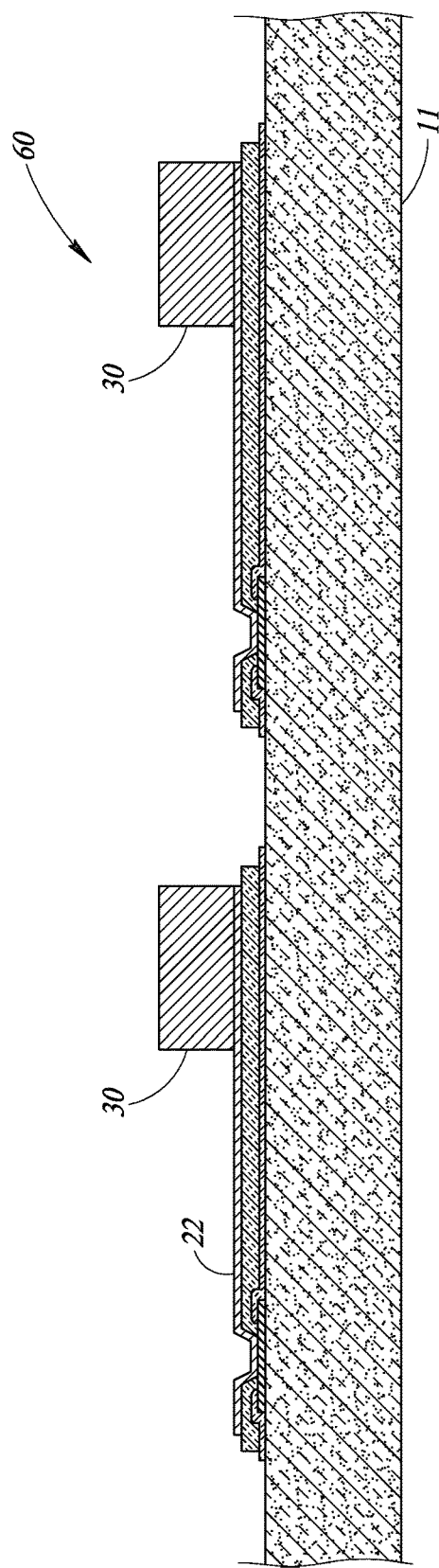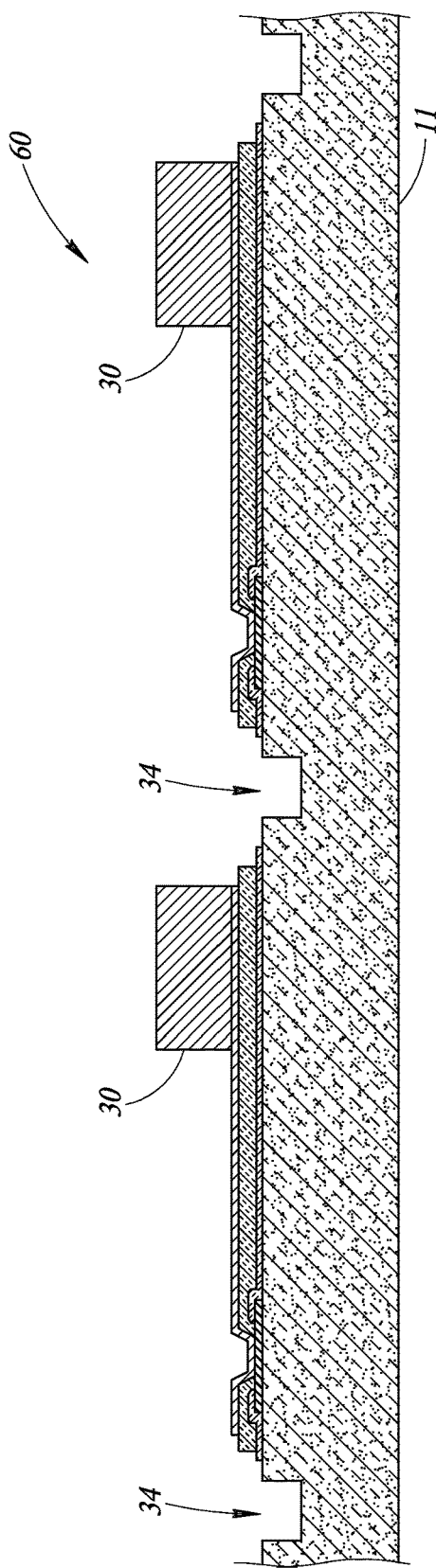
FIG.2C
FIG.2D

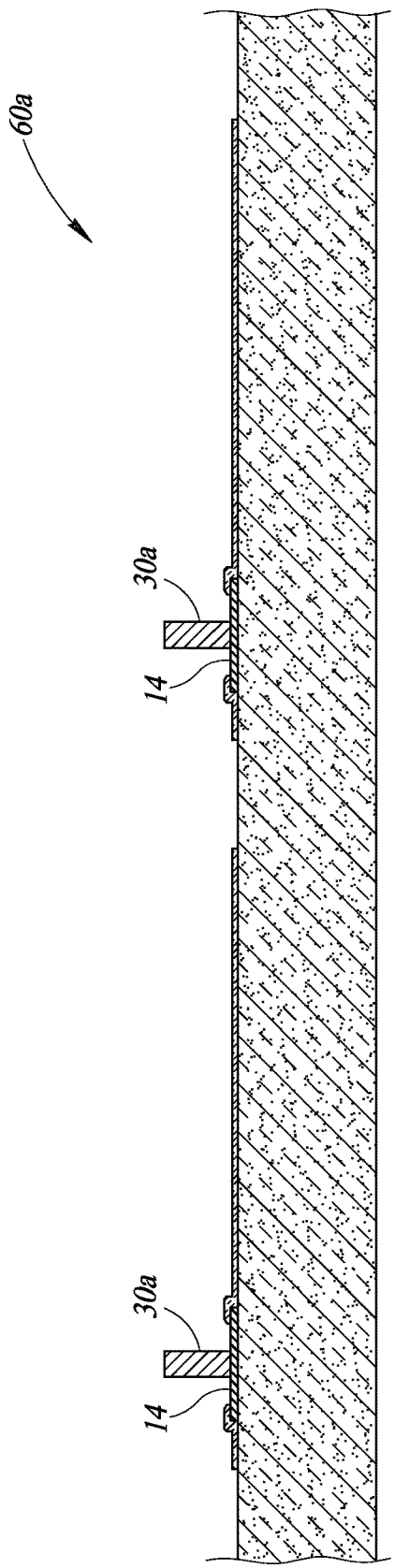
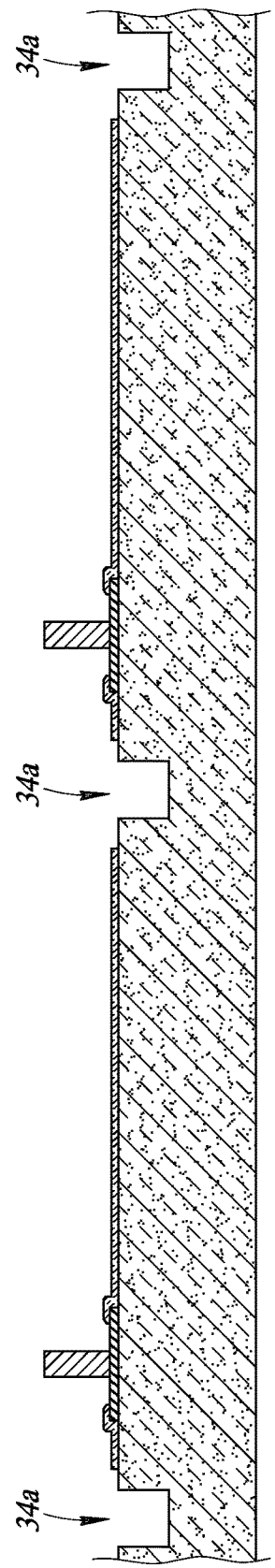
FIG.4A
FIG.4B

SEMICONDUCTOR PACKAGES WITH PILLAR AND BUMP STRUCTURES

BACKGROUND

Technical Field

Embodiments of the present disclosure are related to semiconductor dice packaging and processes for assembling same.

Description of the Related Art

Chip-scale packages (CSP) have a footprint that is very close to the actual area of the semiconductor die and typically involve mounting the package to a substrate or other device by conductive bumps in flip chip configurations. Wafer-level packaging (WLP) refers to the process in which dice on a wafer are processed for packaging using back-end wafer processing before the wafer is singulated.

Wafer-level chip-scale packaging (WLCSP) typically involves a bumping process that includes adding conductive bumps or balls to each semiconductor die on the wafer. Typically, a plurality of bumps are first formed on an upper surface of the semiconductor die. Then the wafer is singulated to separate the dice from each other. The die may then be placed face down onto another substrate so that the conductive bumps are aligned with lands of the substrate. Underfill material may be provided between the die and the substrate to surround the bumps, thereby providing further structural support.

In wafer-level processing, the singulation process can cause defects in the dice. For instance, singulation using a saw blade may crunch portions of the die or causing chipping in one or more layers in the die. Even if the crunched portions and chipped layers are not in active areas on the die, they can cause structural weaknesses that cause cracks to propagate through the die, thereby causing reliability issues.

BRIEF SUMMARY

One or more embodiments are directed to semiconductor structures that include a pillar and bump structures. The semiconductor structures include an encapsulation layer that surrounds side surfaces of the pillars. The structure may be a wafer that is singulated into a plurality of dice or packages.

In one embodiment, a wafer with a plurality of semiconductor dice is provided. Conductive pillars and redistribution layers (RDL) are formed over an upper surface of the semiconductor dice. In one embodiment, the conductive pillars are located over conductive pads of the redistribution layers. An encapsulation layer, such as molding compound, is formed over the upper surface of the dice and around the conductive pillars and the redistribution layers. In some embodiments, the encapsulation layer extends into recesses formed in the upper surface of the wafer. The recesses are located in the saw or scribe streets between the dice. Upper surfaces of the conductive pillars are exposed and conductive bumps are formed on the exposed upper portions of the conductive pillars. The wafer may be singulated to form individual packages.

In another embodiment, the conductive pillars are located on contact pads of the semiconductor dice. The encapsulation layer is formed over the upper surface of the dice and around the conductive pillars. A redistribution layer is formed over the encapsulation layer and redistributes the input/output (i/o) pad for the package. Upper surfaces of the conductive pillars are exposed, and conductive bumps are formed on the exposed upper portions of the conductive pillars.

BRIEF DESCRIPTION OF THE SEVERAL VIEWS OF THE DRAWINGS

In the drawings, identical reference numbers identify similar elements. Sizes and relative positions of elements in the drawings are not necessarily drawn to scale.

FIGS. 2A-2G are partial schematic cross-section views of various stages for the bumping process for the die of FIG. 1.

FIGS. 4A-4F are partial schematic cross-section views of various stages for the bumping process for the die of FIG. 3.

DETAILED DESCRIPTION

In the following description, certain specific details are set forth in order to provide a thorough understanding of various aspects of the disclosure. However, the invention described within the disclosure may be practiced without these specific details. In some instances, well-known structures and methods of forming the structures associated with the semiconductor die have not been described in detail to avoid obscuring the descriptions of the embodiments and aspects of the present disclosure.

Figure 1:
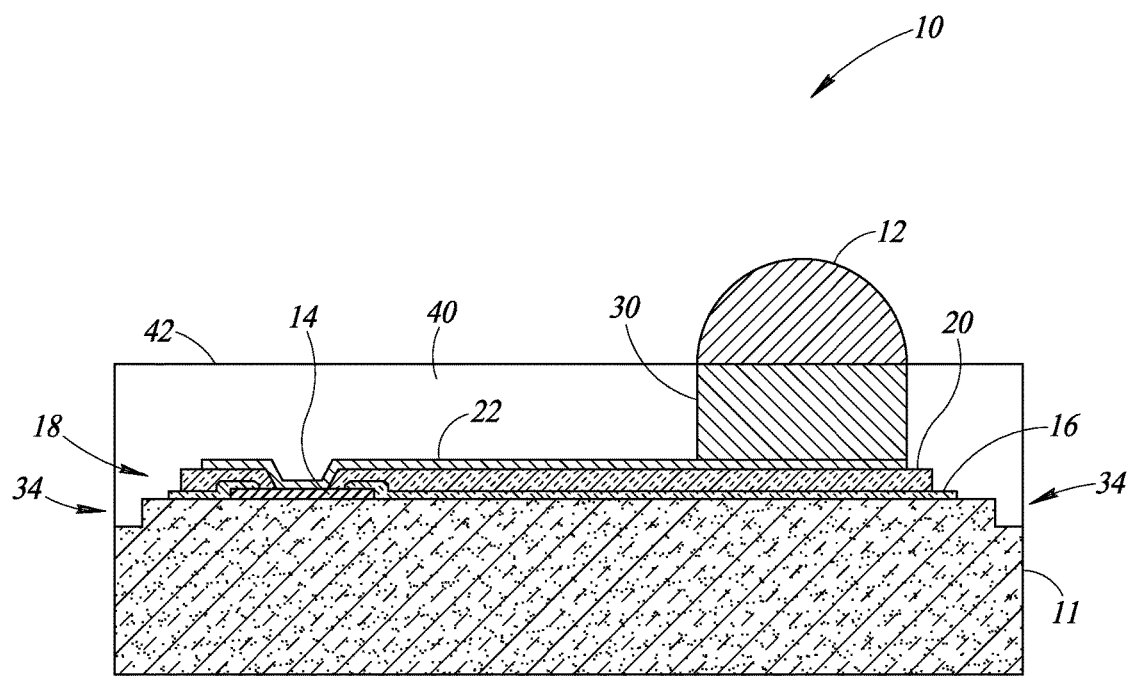
FIG. 1 is a schematic cross-section view of a portion of a package with a conductive bump according to one embodiment of the present disclosure.

FIG. 1 is a schematic side view of a package 10 that includes a semiconductor die and at least one bump 12, in accordance with one embodiment of the invention. The semiconductor die includes a semiconductor substrate 11, such as silicon, and includes one or more electrical components including passive and active components, such as an integrated circuit, as is well known in the art. The semiconductor substrate may have been thinned to have a thickness in a range of about 200 microns to 400 microns.

An upper surface of the die includes one or more contact pads 14 that are electrically coupled to the integrated circuit. In that regard, the contact pads 14 provide electrical communication for the integrated circuit external to the die. The contact pads 14 may be any suitable conductive material, and in one embodiment include aluminum.

Over the upper surface of the die is a first dielectric layer 16, referred to also as a first passivation layer. The first dielectric layer 16 may be any dielectric material that provides protection for the electrical components of the die. The first dielectric layer 16, which in some embodiments is silicon nitride, includes openings over the contact pads 14, thereby exposing at least a portion of each contact pad 14.

Over the first dielectric layer 16 is a redistribution layer (RDL) 18 for redistributing the contact pads 14 as is well known in the art. The redistribution of the contact pads 14 not only redistributes the contact pad but also may increase the size of the contact pad being redistributed as well as provide suitable spacing between adjacent redistributed contact pads or i/o pads.

The RDL 18 includes a second dielectric layer 20, referred to also as a second passivation layer or a re-passivation layer. The second dielectric layer 20 may be thicker than the first dielectric layer 16. The second dielectric layer 20 includes openings over the contact pads 14. In the illustrated embodiment, the second dielectric layer 20 completely covers the first dielectric layer 16 including over the contact pads 14. The second dielectric layer 20 may be any dielectric layer and in some embodiments is polyimide or poly(p-phenylene-benzobisoxazole) (PBO).

The RDL 18 further includes one or more conductive layers 22 that redistributed the contact pad 14. The conductive layer 22 may include one or more conductive materials that extends into the openings of the first and second dielectric layers 16 and 20 to make contact with the respective contact pad 14. The conductive layer 22 further includes a trace that extends along the upper surface of the second dielectric layer 20 and a redistribution pad or an i/o pad. In that regard, the conductive layer 22 provides an electrical path between the contact pads 14 and the i/o pads. The one or more conductive layers 22 may include any conductive materials, and in one embodiment is copper.

Over the i/o pads are conductive pillars 30. The conductive pillars 30 are in electrical communication with the contact pads 14 through the conductive layer 22 of the RDL 18. The conductive pillar 30 may be any conductive material, and in one embodiment is copper. The conductive pillar 30 may extend upward from the surface of the i/o pads in any shape including round, oval, square, hexagon, octagonal, etc. The conductive pillar 30 has a height that is sufficient to space the conductive pillar 30 from conductive layer 22 so that the conductive layer 22 may be covered by a dielectric material, as will be discussed below. In some embodiments, the conductive pillar is between 20-100 microns and in one embodiment is between 30-80 microns.

At the upper surface of the semiconductor substrate 11 of the die is a recess 34. The recess 34 is located at a perimeter of the semiconductor die and extends into the semiconductor substrate 11. The recess 34 may surround the entire perimeter of the die or may extend along one or more side surfaces of the die. In the illustrated embodiment, the recess 34 forms two perpendicular surfaces, but the recess 34 may be any shape, including one that causes the semiconductor substrate 11 in the recess to be sloped or rounded at the corner.

In the illustrated embodiment, the recess 34 has a depth that is less than about 20% of the thickness of the semiconductor substrate 11. The recess 34 may have any depth such that the remaining portion of the semiconductor substrate 11 below the recess 34 has suitable strength to withstand downstream processing including assembly. In one embodiment, the recess 34 has any depth that is less than 50% of the thickness of the semiconductor substrate 11.

An encapsulation layer 40 is located in the recess 34, over the upper surface of the die, and along side surfaces of the pillar 30. The recess 34 is filled with the encapsulation layer 40. The pillar 30 has an upper surface that is coplanar with the upper surface of the encapsulation layer 40. In that regard, at least one portion of the thickness of the encapsulation layer 40 is substantially similar to the thickness of the pillar 30.

The encapsulation layer 40 may be a molding compound, such as a polymer resin. The encapsulation layer 40 may provide improved protection of the electrical features of the semiconductor die. For instance, the encapsulation layer 40 may provide improved adhesive properties, thereby providing improved protection of the package 10. Due to the encapsulation layer 40 being located in the recess 34, the encapsulation layer 40 provides improved protection of the side surfaces and perimeter of the semiconductor die during subsequent processing, such as dicing.

Furthermore, the encapsulation layer 40 protects various portions of the die from external environmental sources of damage, such as corrosion, physical damage, moisture damage, or other causes of damage to electrical devices. For instance, in some cases the encapsulation layer 40 may prevent the first and/or second dielectric layers from delaminating, thereby reducing electrical failures occurring in semiconductor dice due to passivation delamination. In some embodiments, the encapsulation layer may reduce chipping and crunching caused during the singulation process, such as sawing or laser cutting.

Conductive bumps 12 are located on the conductive pillars 30. The conductive bumps 12 are configured to electrically couple electrical components of the die of the package 10 to lands of another substrate or device for flip chip packaging as is well known in the art. The conductive bumps 12 may be any material capable of providing electrical communication and mechanical coupling between the die and the substrate or device it is later coupled to. In some embodiments, the conductive bump 12 is copper, lead, tin, silver, or any combination thereof.

Although only one bump 12 and pillar 30 are shown, it is to be understood that the package 10 includes a plurality of contact pads 14, each with a respective conductive bump 12 and conductive pillar 30 coupled thereto. One bump, pillar, and contact pad are shown so that details of the invention can be more clearly shown in the figures.

Figure 2A:
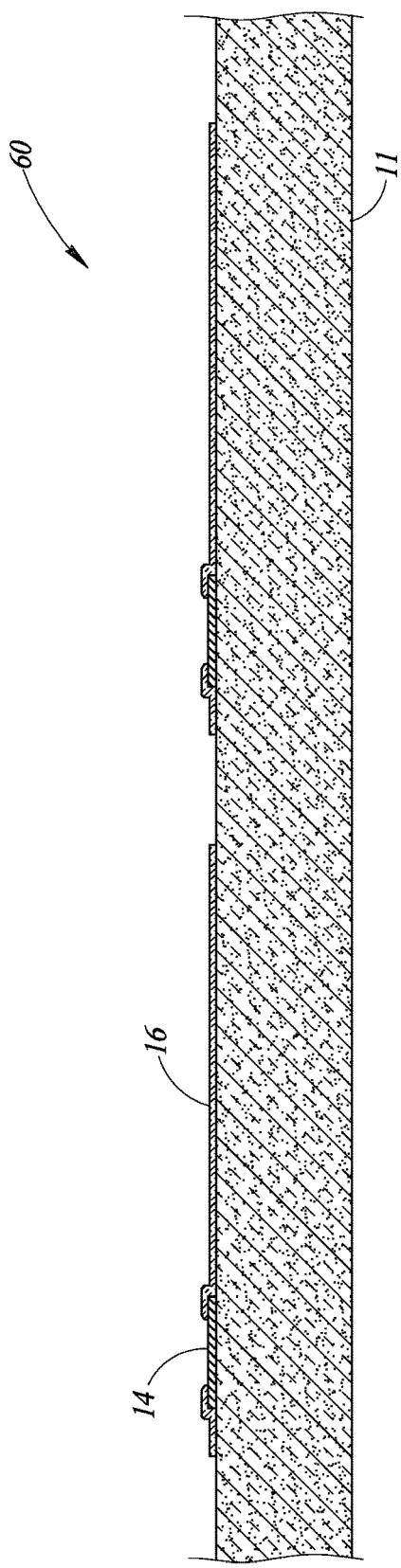

FIGS. 2A-2F illustrate cross-section views of a wafer 60 at various stages of manufacture for forming the package 10 of FIG. 1. As shown in FIG. 2A, a wafer 60 that includes a plurality of dice is provided. The electrical features, such as the bond pads and integrated circuits associated with dice, have already been formed. In that regard, frontend processing of the wafer has been completed. It is to be understood that one of the last steps of frontend processing includes forming the first dielectric layer 16, which is deposited on the wafer 60 using standard semiconductor processing techniques. The first dielectric layer 16 may be deposited using a mask layer over the contact pads 14 of each die as is well known in the art. Alternatively, the first dielectric layer 16 is blanket deposited over the entire wafer 60, and portions of the first dielectric layer 16 are removed, such as by an masked etching over the contact pads 14 as is well known in the art.

Figure 2B:
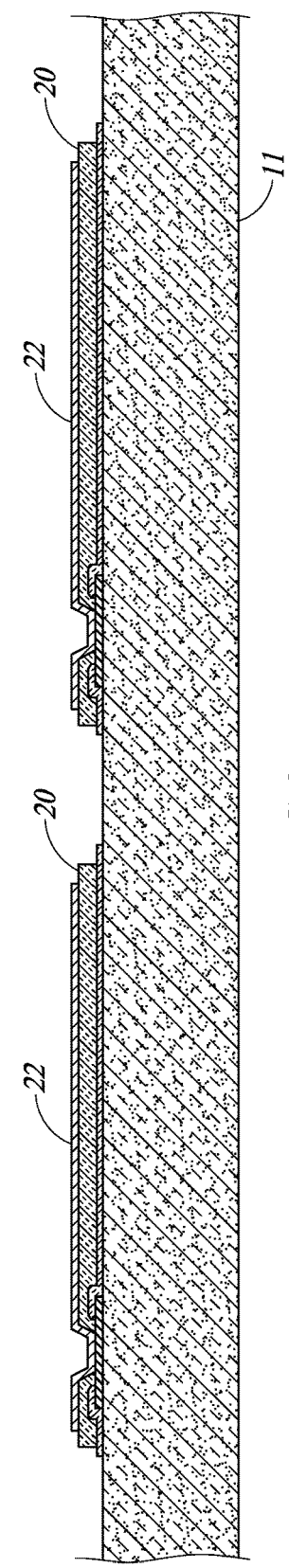

As shown in FIG. 2B, a redistribution layer 18 is formed over the first dielectric layer 16. The redistribution layer 18 includes depositing the second dielectric layer. As mentioned above, the second dielectric layer 20 may be the same material as or a different material than the first dielectric layer 16.

As shown in FIG. 2B, the conductive layer 22 of the redistribution layer is formed over the second dielectric layer. The conductive layer 22 may be deposited by standard processing techniques. The conductive layer 22 may include a plurality of conductive layers that are deposited successively. Furthermore, the via of the conductive layer 22 may be formed in a separate step from the trace.

As shown in FIG. 2C, pillars 30 are formed on the conductive layer 22. In some embodiments, conductive materials may be deposited between the i/o pad of the conductive layer 22 and the pillar 30 to improve the adhesion between the pillar 30 and the conductive layer 22. The pillar may be deposited using standard semiconductor processing techniques.

As shown in FIG. 2D, recesses 34 are formed in the streets between the dice. The recesses 34 may be formed by any method for forming recesses using semiconductor processing techniques, including etching, laser cutting, and sawing. In one embodiment, a laser is used. The laser step may include a multi-step process in which two narrow beams are directed at the streets of the wafer between the dice. The wafer and laser are moved relative to each other in a grid pattern so that the laser cuts into the streets of the semiconductor substrate in a grid pattern. In a first pass over the grid of the wafer, the beams are spaced from each other by a first distance, thereby removing a portion of the semiconductor substrate 11 at a desired depth. In a second pass, the narrow beams are placed closer together to further remove the semiconductor substrate 11 at the same depth. In a third pass a wide beam laser may be directed at the recess to remove any remaining portions of the semiconductor substrate in the recess.

Figure 2E:
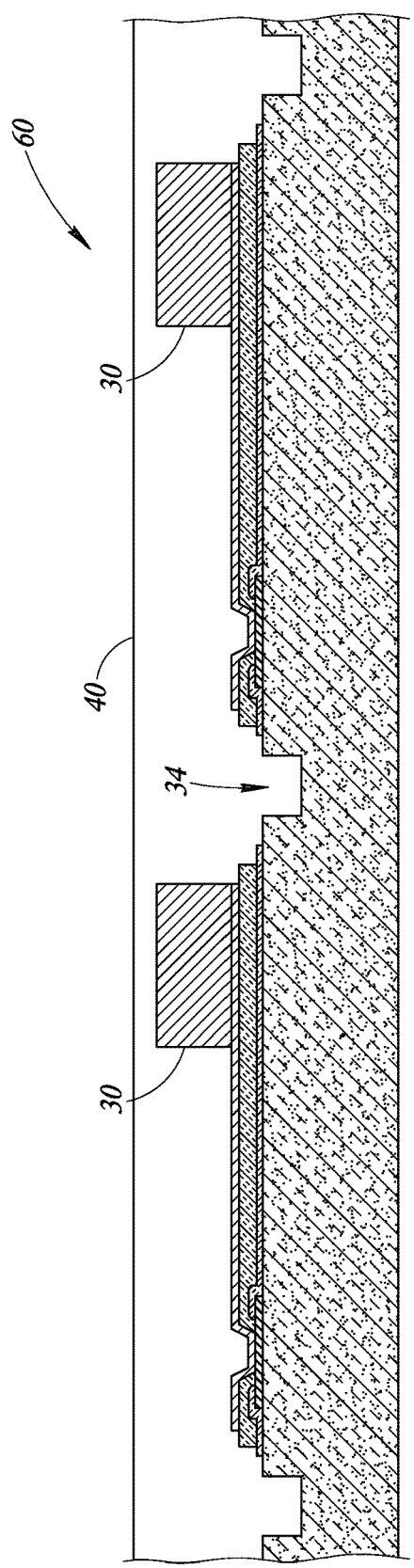

As shown in FIG. 2E, the encapsulation layer 40 is formed over the wafer 60, covering the upper surface of the wafer 60 and filling the recesses 34 in the streets. The encapsulation layer 40 may be formed by a molding processing in which a flowable material is provided into a mold that holds the wafer 60 and allowed to set or harden over time. The setting or hardening of the flowable material may include one or more curing steps. In one embodiment, the encapsulation layer 40 is a molding compound, such as a polymer resin.

Figure 2F:
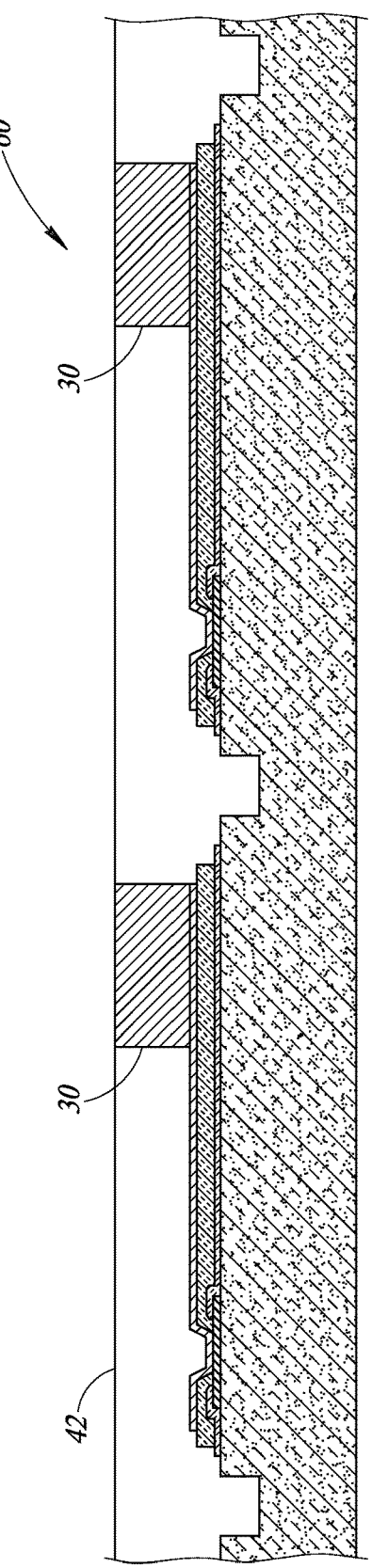

As shown in FIG. 2E, the encapsulation layer 40 may fully surround the pillars. As shown in FIG. 2F, the wafer 60 may be thinned to remove a portion of the encapsulation layer 40, thereby exposing the pillar 30. In that regard, an upper surface 42 of the encapsulation layer 40 is coplanar with the upper surface of the pillar 30. The wafer may be thinned in a grinding step, which may include a slurry. The thinning process may be any process configured to remove the encapsulation layer 40 to expose the upper surface of the pillar 30, including chemical-mechanical polishing (CMP).

Figure 2G:
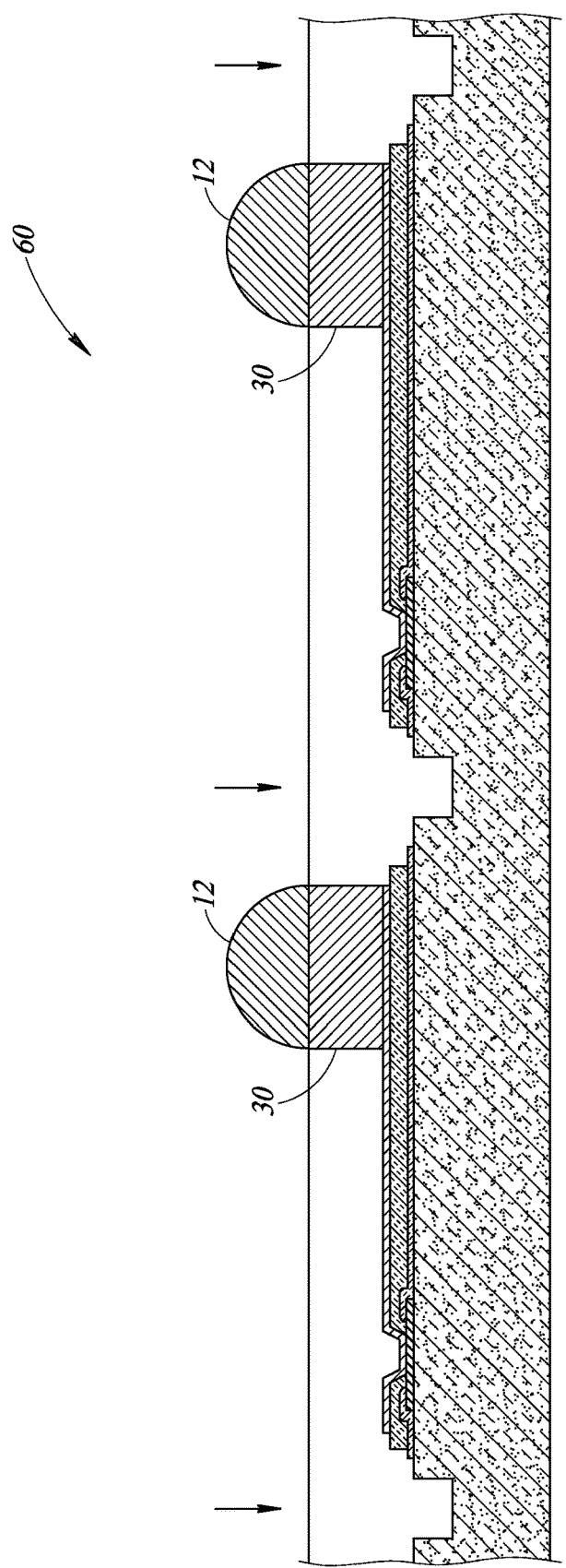

As shown in FIG. 2G, a conductive bump 12 is formed on the exposed surface of the pillar 30. The conductive bump 12 is formed by standard semiconductor processing techniques, including solder bump drop as is well known in the art.

As shown in FIG. 2G, the wafer 60 is singulated in the streets to separate the dice into individual packages as indicated by the arrows. The singulation step may be performed by any suitable semiconductor processing techniques, such as sawing or laser cutting. The wafer is singulated in the streets at the recesses 34 filled with encapsulation layer 40. Due to the recess 34, the semiconductor substrate 11 is thinner in the streets than on the rest of the wafer. Due to the reduced thickness of the semiconductor substrate 11 and the encapsulation layer 40 in the recess 34, the wafer is substantially easier to singulate than in the prior art. The encapsulation material is a softer material than the semiconductor substrate 11, making it easier to cut through. Thus, saw blade life improves and singulation processing time is reduced. Furthermore, the encapsulation layer 40 has good adhesive properties, thereby providing better protection of electrical features on the package 10. Furthermore, the recess 34 being filled with encapsulation layer 40 provides more surface area of the die being covered with the encapsulation material before electrical features are reached, thereby providing better protection and improved reliability over the prior art.

Singulating the wafer may remove the recess 34 filled with encapsulation layer 40 due to the thickness of the saw blade or the thickness of the laser beam. Alternatively, a portion of the recess 34 filled with encapsulation layer 40 may remain at the perimeter of the dice as shown in FIG. 1. It is to be understood that in some embodiments, the recesses 34 that remain on the die may be any size, and in some embodiments, the recesses 34 are completely removed during the singulating step.

Figure 3:
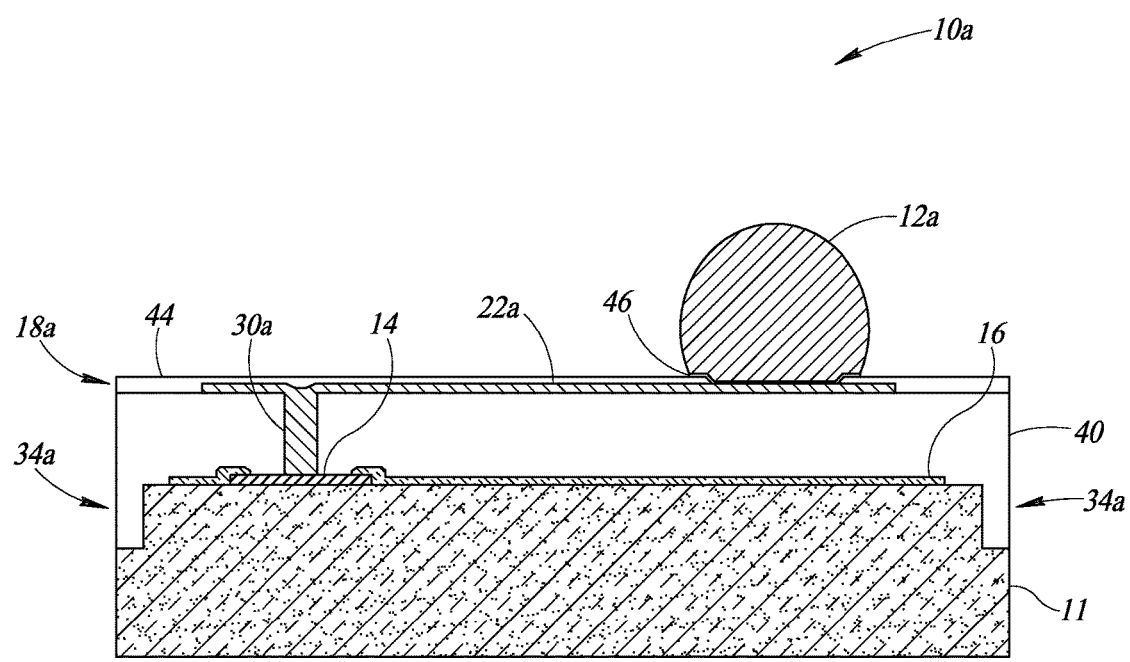
FIG. 3 is a schematic cross-section view of a portion of a package according to another embodiment of the present disclosure.

FIG. 3 illustrates a package 10a according to a second embodiment. Many features of the package 10a of FIG. 3 are similar to the package 10 of FIG. 1. The features of the package 10a of FIG. 3 that have the same structure and function as the package 10 of FIG. 1 will not be described again in the interest of brevity, while the difference will be discussed below.

As shown in FIG. 3, a pillar 30a is located on the contact pad 14. The pillar 30a is similar to the pillar 30 of FIG. 1; however, the pillar 30a of FIG. 3 may be smaller in size, as shown. In the illustrated embodiment, the pillar 30a is in direct contact with the contact pad 14 but may also have a conductive layer therebetween.

The die includes a recess 34a at the perimeter of the semiconductor substrate 11. Although the recess 34a has a depth that is greater than the depth of the recesses 34 of FIG. 1, it is to be understood that the depth of the recess 34a may be any depth that is less than 50% of the thickness of the semiconductor substrate 11.

The encapsulation layer 40 is located over the die, in the recess 34a, and along side surfaces of the pillar 30a. Over the upper surface of the encapsulation layer 40 is a RDL 18a that redistributes the contact pad 14 for the die. The RDL 18a includes one or more conductive layers 22a and an upper dielectric layer 44. The conductive layer 22a includes a first contact pad, a trace, and i/o pad. The upper dielectric layer 44 protects the conductive layer 22a. The upper dielectric layer 44 may be any dielectric layer configured to adhere to the conductive layer 22a and the encapsulation layer 40.

A conductive bump 12a is located over i/o pad of the conductive layer 22a. Under bump material (UBM) 46 may be provided under the conductive bump 12a on the i/o pad as is well known in the semiconductor industry. The UBM 46 may be any material that improves adhesion between the conductive layer 22a and the conductive bump 12a.

FIGS. 4A-4F illustrate cross-section views of a wafer 60a at various stages of manufacture for forming the package 10a of FIG. 3. Many of the manufacturing steps are similar to those performed in reference to FIGS. 3A-3G, however, the order may be different. The details of those steps will not be repeated in the interest of brevity.

Figure 4C:
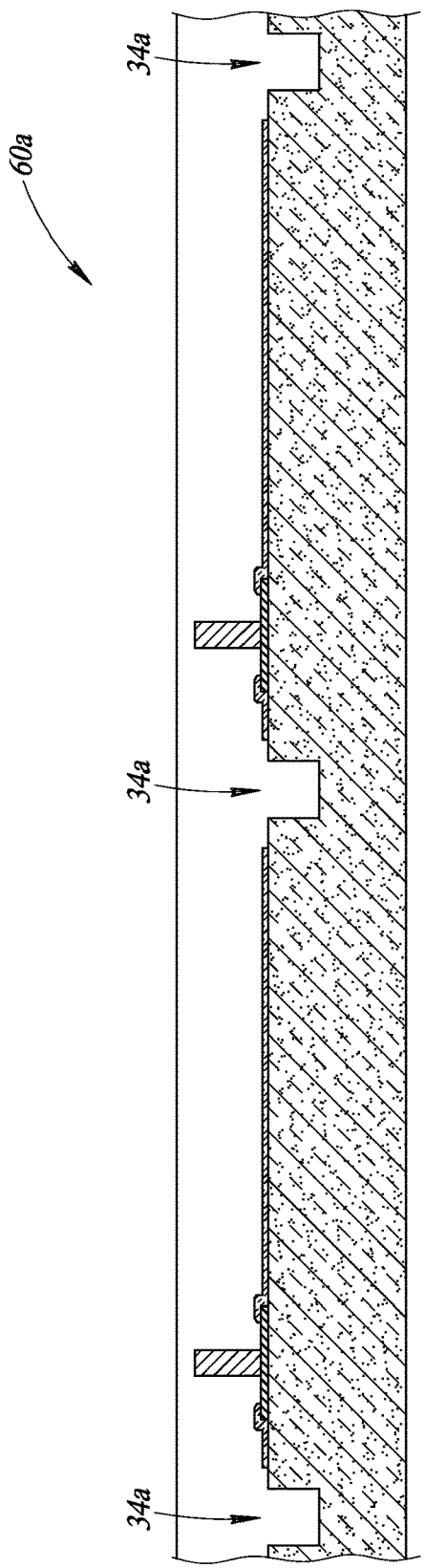
Figure 4D:
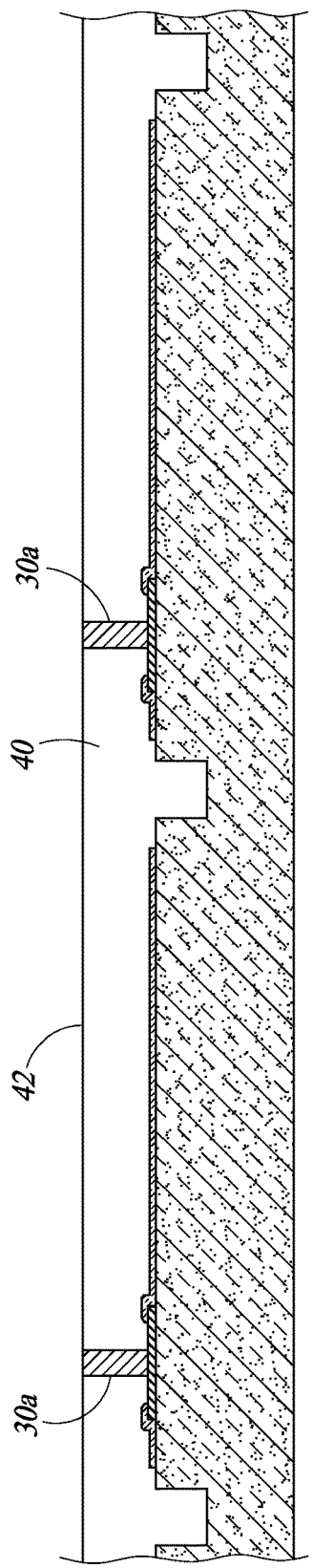
Figure 4E:
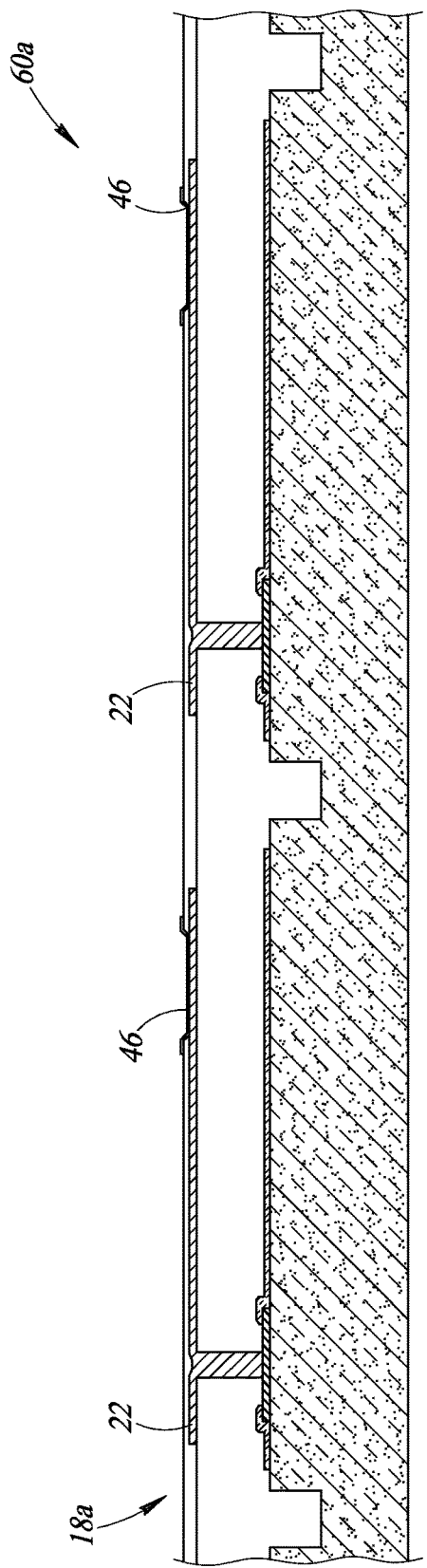
Figure 4F:
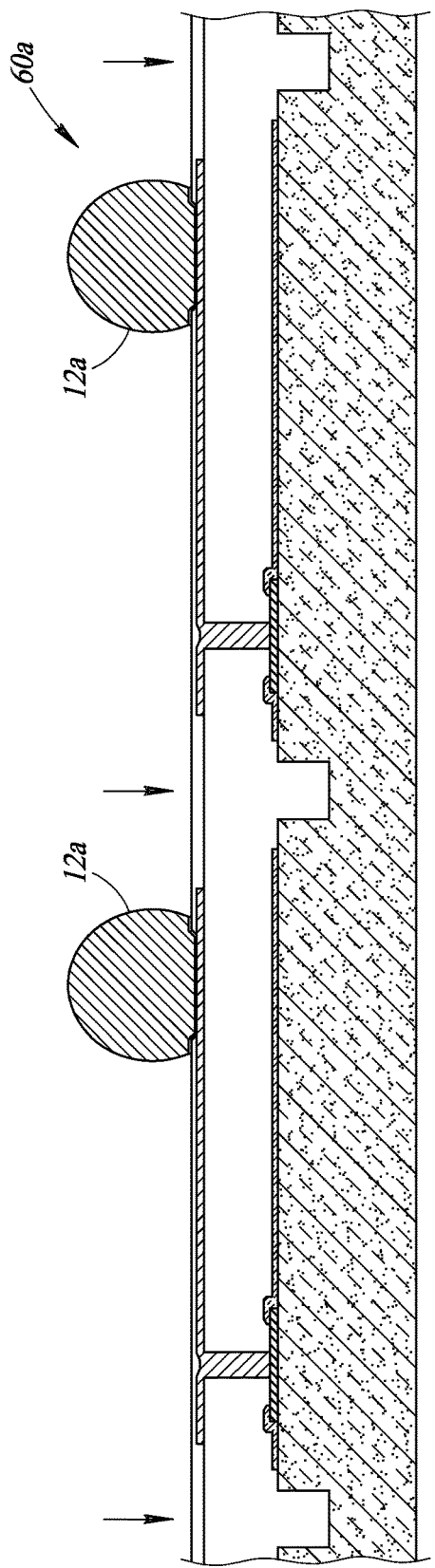

As shown in FIG. 4A, pillars 30a are formed on the contact pads 14 of the wafer 60a. As shown in FIG. 4B, recesses 34a are formed in the streets of the wafer 60a between each dice. As shown in FIG. 4C, the encapsulation layer 40 is formed over the surface of the wafer 60a, filling the recesses 34a and covering at least side surfaces of the pillars 30. As shown in FIG. 4D, a portion of the upper surface of the encapsulation layer 40 may be removed to expose the pillars 30a. As shown in FIG. 4E, the redistribution layer 18a is formed over the encapsulation layer and the pillars. As shown in FIG. 4F, conductive bumps 12a are formed on the i/o pads of the redistribution layer 18a. The wafer 60a is singulated in the streets between the dice as indicated by the arrows to form a plurality of individual packages.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor structure comprising:
a semiconductor die having a surface of the semiconductor die;
a first contact pad located on the surface;
a conductive pillar in direct contact with the first contact pad, the conductive pillar having a width that is less than a width of the first contact pad;
an encapsulation layer located over the surface and around side surfaces of the conductive pillar, a surface of the encapsulation material being coplanar with a surface of the conductive pillar;
a redistribution layer covering the encapsulation layer such that the encapsulation material is between the redistribution layer and the surface of the semiconductor die, the redistribution layer including a trace and a redistributed contact pad, the redistributed contact pad being laterally offset from the first contact pad and in electrical communication with the first contact pad by the conductive pillar; and
a conductive bump on the redistribution contact pad that is located above the encapsulation layer.

2. The semiconductor structure of claim 1 wherein the conductive pillar is located on the first contact pad.

3. The semiconductor structure of claim 1 wherein the redistribution layer is located over the conductive pillar.

4. The semiconductor structure of claim 1 wherein the conductive pillar has a first surface and the encapsulation layer has a second surface, wherein the first surface is flush with the second surface.

5. The semiconductor structure of claim 1 wherein the encapsulation layer is a molding compound.

6. The semiconductor structure of claim 5 wherein the molding compound is a resin.

7. The semiconductor structure of claim 1 wherein the semiconductor die has a perimeter and includes a recess at the perimeter of the die.

8. A method comprising:
forming conductive pillars directly on contact pads of a surface of a semiconductor die, the conductive pillars having widths that are less than widths of the contact pads;
forming an encapsulation layer over the surface of the semiconductor die and at least along side surfaces of the conductive pillars;
planarizing the encapsulation layer to expose surfaces of the conductive pillars such that the exposed surfaces of the conductive pillars are coplanar with a surface of the encapsulation material;
forming a redistribution layer over the encapsulation layer such that the encapsulation material is between the redistribution layer and the surface of the semiconductor die, the redistribution layers including traces and redistributed contact pads that are in electrical communication with the contact pads by the conductive pillars, respectively; and
forming conductive bumps on the redistribution contact pads, the conductive bumps being above the encapsulation layer.

9. The method of claim 8 further comprising forming a recess at a perimeter of the semiconductor die at the surface, wherein forming the encapsulation layer includes filling the recess with the encapsulation layer.

10. The method of claim 8 further comprising forming recesses in the wafer between a plurality of semiconductor dice, wherein forming the encapsulation layer comprises filling the recesses with the encapsulation layer.

11. The method of claim 8 wherein forming the encapsulation layer comprises using a mold to inject a molding compound.

12. A semiconductor package comprising:
a semiconductor die;
a first contact pad located on a surface of the semiconductor die;
a conductive pillar located on and in direct contact with the first contact pad, the conductive pillar having a width that is less than a width of the first contact pad;
an encapsulation layer surrounding side surfaces of the conductive pillar and covering a portion of the first contact pad, a surface of the encapsulation material being coplanar with a surface of the conductive pillar;
a redistribution layer including a trace and a redistributed contact pad covering the encapsulation layer such that the encapsulation layer is between the surface of the semiconductor die and the redistribution layer, the redistributed contact pad in electrical communication with the first contact pad by the conductive pillar; and
a conductive bump on the redistribution contact pad and located above the encapsulation layer.

13. The semiconductor package of claim 12 wherein the conductive pillar has a smaller cross sectional dimension than an exposed surface of the first contact pad.

14. The semiconductor package of claim 12 wherein the trace of the redistribution layer covers the pillar.

* * * * *